US012546461B2

United States Patent
Komancsik

(10) Patent No.: US 12,546,461 B2
(45) Date of Patent: Feb. 10, 2026

(54) CONNECTED LED LAMP IMPLEMENTED ON A SINGLE METAL CORE PRINTED CIRCUIT BOARD

(71) Applicant: Silicon Laboratories Inc., Austin, TX (US)

(72) Inventor: Marton Komancsik, Budapest (HU)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 18/758,047

(22) Filed: Jun. 28, 2024

(65) Prior Publication Data

US 2025/0320984 A1     Oct. 16, 2025

Related U.S. Application Data

(60) Provisional application No. 63/632,188, filed on Apr. 10, 2024.

(51) Int. Cl.
*F21V 19/00* (2006.01)
*F21K 9/232* (2016.01)
(Continued)

(52) U.S. Cl.
CPC .......... *F21V 19/0015* (2013.01); *F21K 9/232* (2016.08); *F21K 9/238* (2016.08); *F21V 23/005* (2013.01); *F21V 23/02* (2013.01); *F21V 23/0435* (2013.01); *H01Q 1/22* (2013.01); *H05K 1/05* (2013.01); *H05K 1/181* (2013.01); *F21Y 2105/18* (2016.08); *F21Y 2113/00* (2013.01); *F21Y 2115/10* (2016.08);
(Continued)

(58) Field of Classification Search
CPC ............. F21Y 2115/10; F21V 23/0435; F21V 23/005; F21K 9/238
See application file for complete search history.

(56) References Cited

U.S. PATENT DOCUMENTS 6,166,496 A * 12/2000 Lys ........................ H05B 45/20
315/316
9,810,414 B2 * 11/2017 Kim .................... H05B 47/1965
(Continued)

OTHER PUBLICATIONS

Aguilar, D., and Henze, C.P., "LED Driver Circuit with Inherent PFC," 2010 Twenty-Fifth Annual IEEE Applied Power Electronics Conference and Exposition (APEC), Feb. 21-25, 2010, pp. 605-610.
(Continued)

*Primary Examiner* — Robert J May
(74) *Attorney, Agent, or Firm* — Zagorin Cave LLP

(57) ABSTRACT

A lamp includes a single 1-layer metal core printed circuit board (PCB). The 1-layer metal core PCB includes a plurality of light emitting diodes (LEDs), an LED driver circuit, a microcontroller unit (MCU) providing wireless connectivity and control for the LED driver circuit, and a power supply circuit providing power for the LEDs and the MCU. The lamp includes an antenna, e.g., helical or monopole, mounted on the single 1-layer metal core PCB. Capacitor(s) and/or inductor(s) may be mounted on a bottom side of the 1-layer metal core PCB opposite a top side of the 1-layer metal core PCB on which the LEDs are mounted. The lamp is line powered. The LEDs are disposed on a periphery of a top side of the PCB and the MCU and other circuitry is disposed on the top side of the PCB inside of the periphery.

17 Claims, 17 Drawing Sheets

(51) Int. Cl.
*F21K 9/238* (2016.01)
*F21V 23/00* (2015.01)
*F21V 23/02* (2006.01)
*F21V 23/04* (2006.01)
*H01Q 1/22* (2006.01)
*H05K 1/05* (2006.01)
*H05K 1/18* (2006.01)
*F21Y 105/18* (2016.01)
*F21Y 113/00* (2016.01)
*F21Y 115/10* (2016.01)

(52) U.S. Cl.
CPC .............. *H05K 2201/10015* (2013.01); *H05K 2201/1003* (2013.01); *H05K 2201/10098* (2013.01); *H05K 2201/10106* (2013.01); *H05K 2201/10522* (2013.01)

(56) References Cited

U.S. PATENT DOCUMENTS

| 11,057,029 | B2 | 7/2021 | Westwick et al. |
| 11,362,646 | B1 | 6/2022 | Tesu et al. |
| 2015/0292686 | A1* | 10/2015 | Negley ................. F21V 3/0625 |
| | | | 362/249.02 |
| 2019/0032887 | A1* | 1/2019 | Joerg ...................... F21K 9/233 |

OTHER PUBLICATIONS

George, J., "Cycle Scavenging on C2000 MCUs, Part 7: PWM Valley Switching," SSZT840, Dec. 2017, pp. 1-4, Texas Instruments Incorporated.
Global Lighting Forum, "Switched Mode LED Power Supplies | SMPS LED Drivers," downloaded from https://www.shine.lighting/products/smps-led-drivers/ on Feb. 23, 2024, 9 pages.
Sangrody, R., et al., "Semi-Valley Switching Method for Buck LED Driver to Increase its Efficiency and Performance," IET Power Electronics, vol. 13, Issue 10, Revised Mar. 10, 2020, pp. 1966-1973.
Silicon Laboratories, "EFR32MG24-Datasheet," Revision 1.1, Mar. 2023, downloaded from Silabs.com on Sep. 2, 2025, 132 pages.

* cited by examiner

CONNECTED LED LAMP IMPLEMENTED ON A SINGLE METAL CORE PRINTED CIRCUIT BOARD

CROSS-REFERENCE TO RELATED APPLICATION(S)

This application claims the benefit of U.S. Provisional Application No. 63/632,188, entitled "Connected LED Lamp Implemented On A Single 1-Layer Metal Core Printed Circuit Board," naming Marton Komancsik as inventor, which application was filed Apr. 10, 2024, and which application is incorporated herein by reference.

BACKGROUND

Field of the Invention

This disclosure relates to light emitting diode (LED) lamps.

Description of the Related Art

Connected lamps (including bulbs and other lighting form factors) are lamps with wireless connectivity that allow wireless control capabilities including lighting control and monitoring. Connected lamps are often the first smart home purchase. FIG. 1 illustrates a current smart LED lamp 100 that includes an LED board 102 with the LEDs 104. The LED board 102 is implemented as a 1-layer Metal Core Printed Circuit Board (MCPCB) for heat dissipation. The connected lamp 100 also includes a wireless module 106 (typically implemented as a 2-4 layer FR4 PCB), an integrated antenna, and a metal shield. The LED lamp 100 further includes a power board 108 implemented as a 1-2 layer PCB with an LED driver circuit and provides a low voltage (e.g., 3.3V) supply for the wireless module 106. Thus, the smart LED lamp 100 requires 3 PCBs and a relatively expensive LED driver solution.

SUMMARY OF EMBODIMENTS OF THE INVENTION

Embodiments described herein provide a lower cost solution for connected lamps by implementing a connected LED lamp on a single metal core printed circuit board (PCB) rather than the three PCBs utilized in the prior art.

In an embodiment a lamp includes a printed circuit board (PCB). The PCB includes a plurality of light emitting diodes (LEDs), an LED driver circuit, wireless connectivity, and a power supply circuit.

In an embodiment the PCB is a 1-layer metal core PCB. The lamp may further include a helical antenna or a monopole antenna coupled to the single 1-layer metal core PCB. At least one capacitor and/or at least one inductor may be mounted on the bottom side of the metal core PCB. In an embodiment the lamp includes microcontroller unit (MCU) with wireless capability to provide the wireless connectivity and includes an antenna coupled to the MCU through a matching network. The MCU provides control for the LED driver circuit.

In an embodiment the driver circuit includes a first transistor configured to turn on a first segment of the LEDs responsive to assertion of a first transistor control signal controlled by the MCU. The driver circuit further includes a second transistor configured to turn on the first segment and a second segment of the LEDs responsive to assertion of a second transistor control signal controlled by the MCU.

The lamp is line powered, i.e., the power supply circuit is coupled to an AC source.

In an embodiment the LEDs are disposed on a periphery of the PCB and the LED driver circuit is disposed inside the periphery.

In another embodiment a lamp includes a 1-layer metal core printed circuit board (PCB). The 1-layer metal core PCB includes, a plurality of light emitting diodes (LEDs), an LED driver circuit, a micro controller unit (MCU) providing wireless connectivity and control for the LED driver circuit, and a power supply circuit providing power for the LEDs and the MCU.

The lamp includes an antenna coupled to the single 1-layer metal core PCB. The antenna may be a helical antenna or a monopole antenna.

In an embodiment at least one capacitor and/or at least one inductor is mounted on a bottom side of the 1-layer metal core PCB opposite a top side of the 1-layer metal core PCB on which the LEDs are mounted.

The LEDs are disposed on a periphery of a top side of the 1-layer metal core PCB and the MCU is disposed on the top side of the 1-layer metal core PCB inside of the periphery.

BRIEF DESCRIPTION OF THE DRAWINGS

The present invention may be better understood, and its numerous objects, features, and advantages made apparent to those skilled in the art by referencing the accompanying drawings.

DETAILED DESCRIPTION

Figure 1:
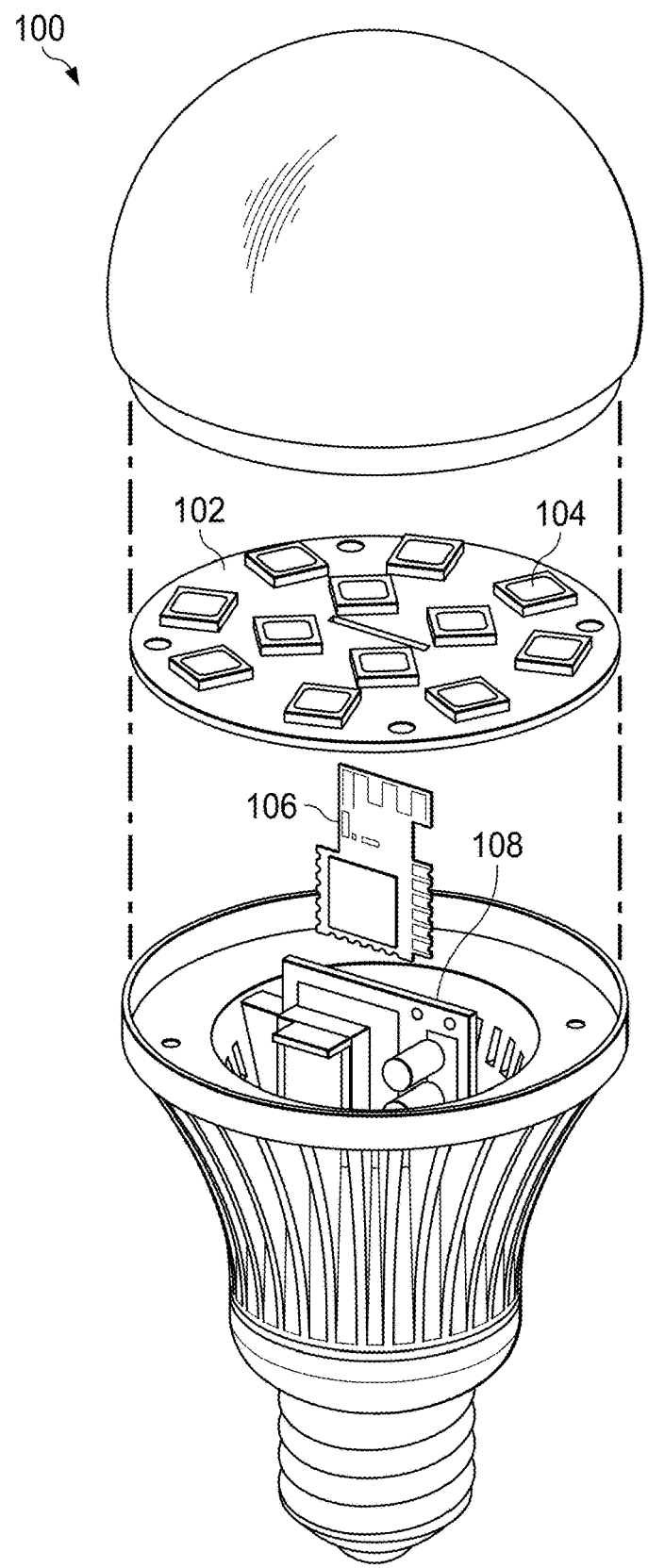
FIG. 1 illustrates a prior art LED lamp.
Figure 2:
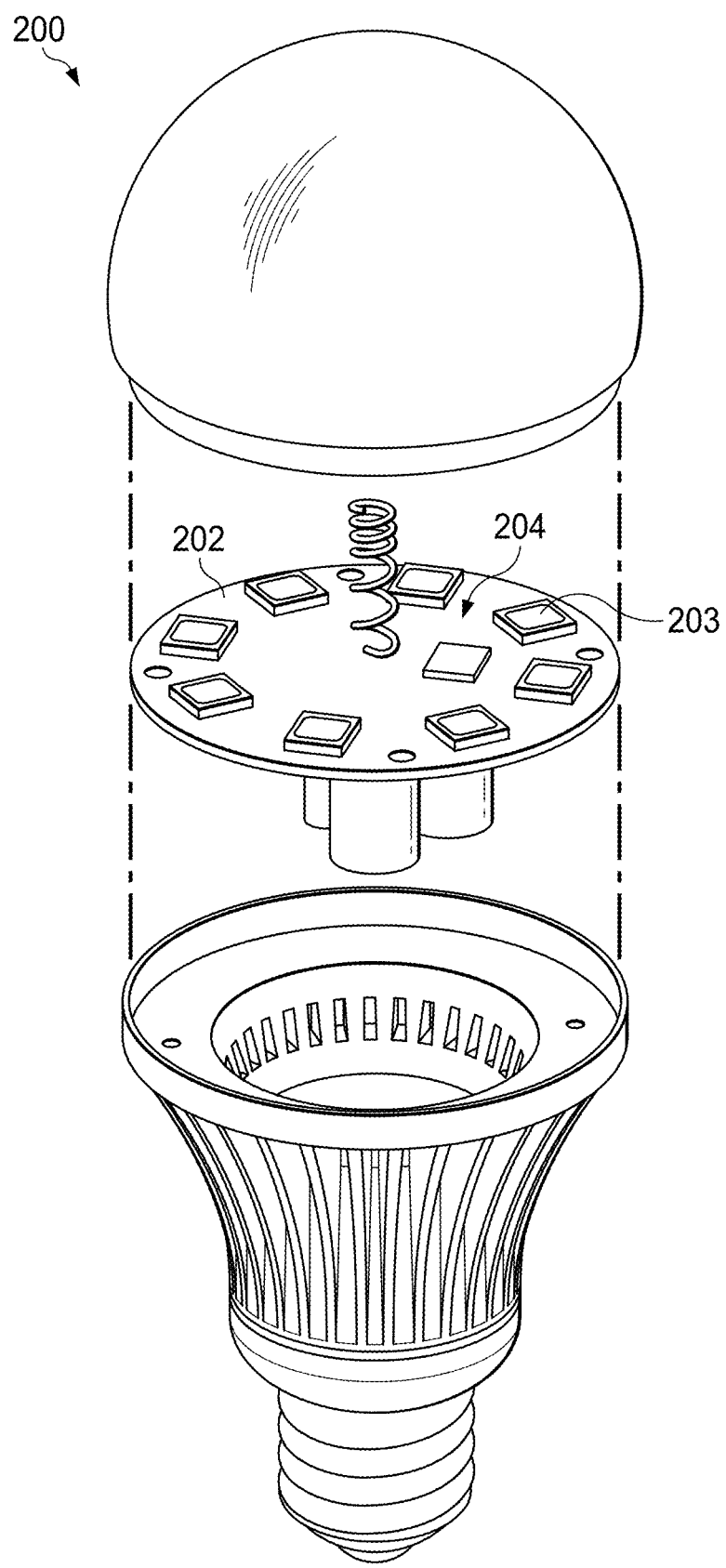
FIG. 2 illustrates a high-level block diagram of an LED lamp according to an embodiment.

Embodiments described herein are applications of wireless system on chips (SoCs) to achieve a complete AC-line powered connected lighting application on a single 1-layer, metal core PCB. The lower cost embodiments described herein result from the use of a single 1-layer PCB instead of the 3 PCB solution illustrated in FIG. 1. The LED lamp embodiments described herein use one (single-layer) metal-core PCB for the electronics, i.e., the LEDs, LED driver(s), wireless connectivity, and power supply circuitry. Various antenna solutions are possible with the single metal core PCB including a straight monopole antenna and a helical antenna (also referred to herein as a vertical coil antenna) mounted on a surface mount device (SMD) pad on the PCB. FIG. 2 illustrates a high level block diagram of an embodiment of an LED lamp 200 with a single metal core PCB 202 with the LEDs 203 on the periphery and the electronics and antenna disposed in the center portion 204 of the PCB board 202. Note that the electronics are shown and discussed in additional detail below.

In an embodiment, the LED driver circuitry on the single metal core PCB is a direct-AC multi-stage linear LED driver where the controller is the wireless microcontroller unit (MCU) instead of a dedicated integrated circuit. In an embodiment the wireless MCU uses its analog to digital converter (ADC) to sense the alternating current (AC) line voltage and uses its general purpose input/outputs (GPIOs) s to directly control transistors that are tapping a high-voltage LED-string at different points depending on the instantaneous AC input voltage. In embodiments the transistors are operated in linear current generator mode, therefore (unlike in switch-mode LED drivers) no inductors are needed. Note that in some embodiments the efficiency of the driver is increased by increasing the number of tapping stages. In an embodiment the MCU controls the LED current (and implements dimming) by driving the transistors with an analog signal using its digital to analog converter (DAC) peripheral or a pulse width modulated (PWM) signal (that may be filtered with a low-pass R-C circuit).

Figure 3:
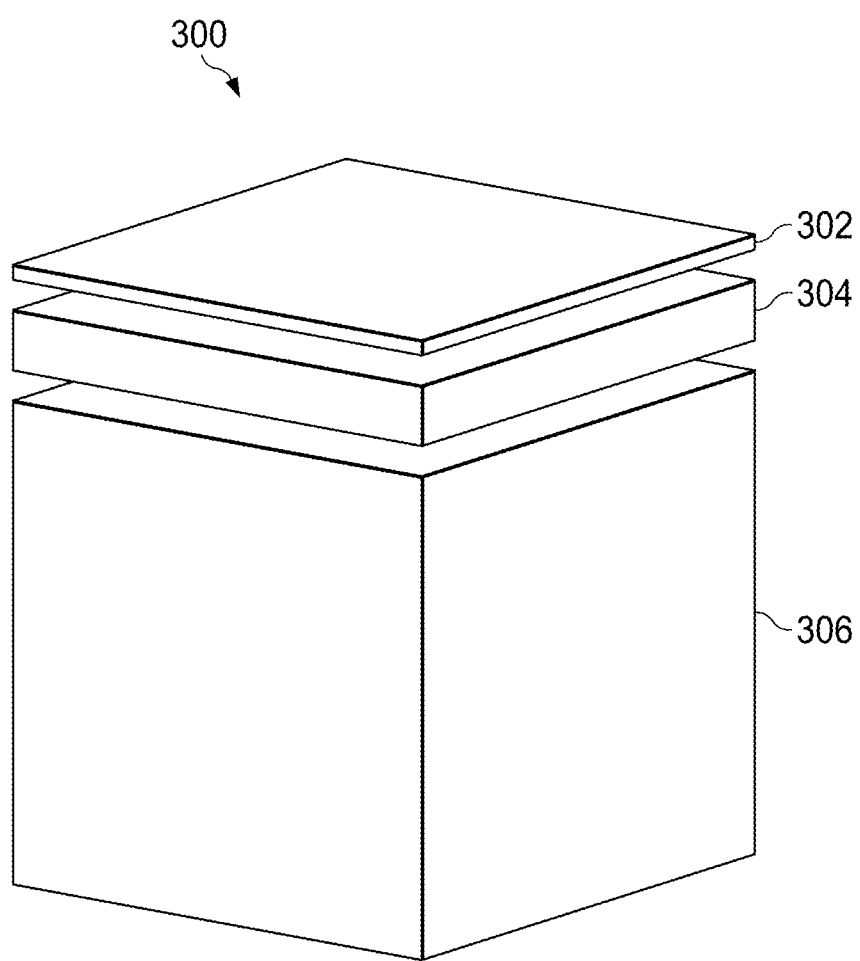
FIG. 3 illustrates an embodiment of a single layer metal-core PCB.

FIG. 3 illustrates an embodiment of a single layer metal-core PCB 300 that can be used in lamp embodiments described herein. The metal core PCB 300 includes a single signal layer 302. A dielectric layer 304 is disposed under the signal layer. The dielectric layer is, e.g., 0.1 mm thick, heat conductive, and has a relatively high dielectric constant (Dk). The core 306 is, e.g., aluminum or copper. The metal core transfers heat from the LEDs and other components to a heatsink (not shown). There are no vias from the core to the signal layer. The signal layer 302 has no vias and there is no dedicated ground layer. However, in embodiments the ground reference on the signal layer is in electrical connection with the metal core by means other than vias, e.g. by metal bolts or via a metallic external housing. Connecting the metal core to the ground reference may be required for operation in at least some embodiments.

Figure 4:
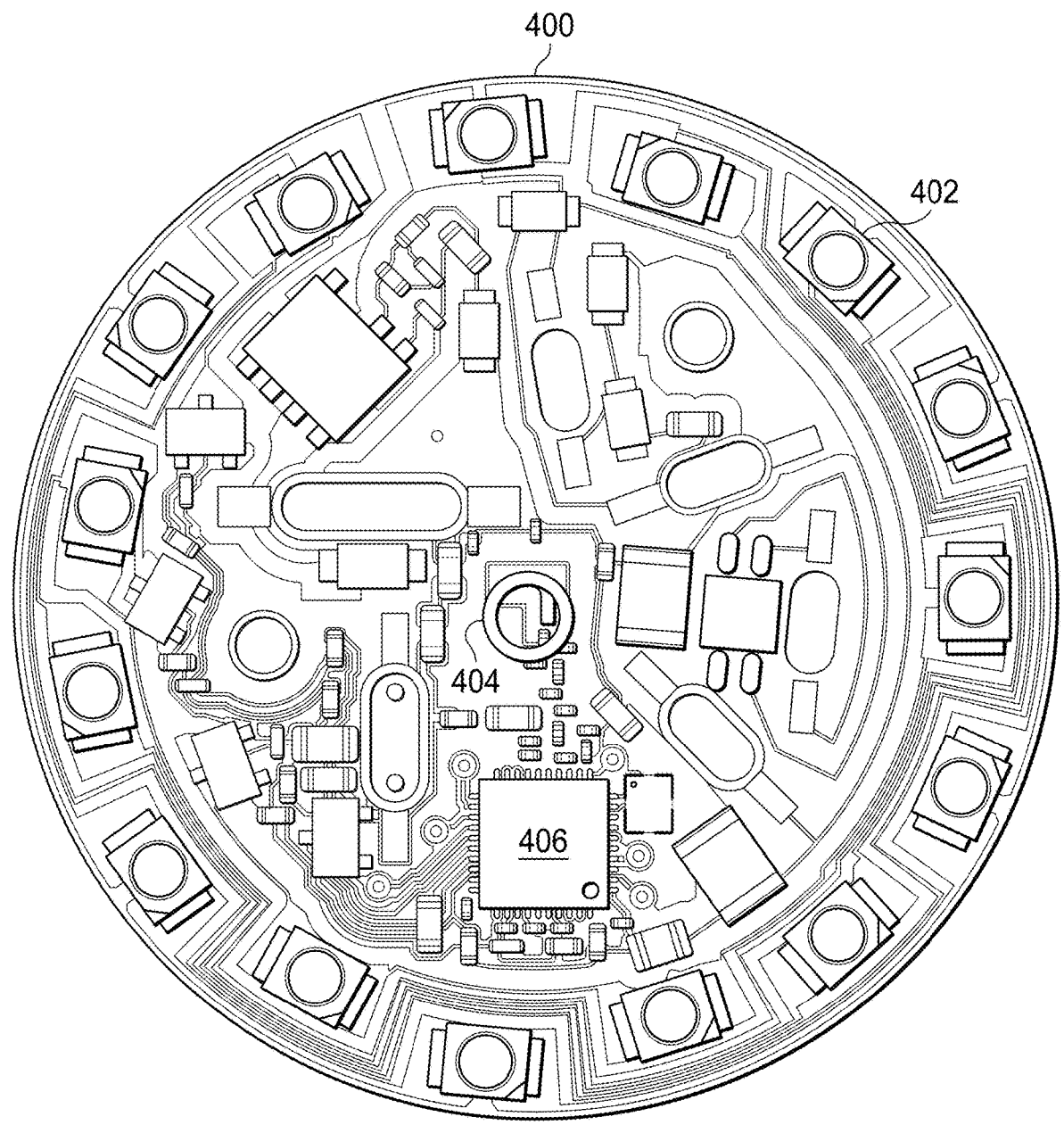
FIG. 4 illustrates a single metal core PCB that includes the LEDs around the periphery of the PCB with other electronics implemented within the periphery.

FIG. 4 illustrates a single metal core PCB 400 that includes the LEDs 402 around the periphery of the PCB with other electronics (described further herein) including the LED driver(s), wireless connectivity, and power supply circuitry implemented in the interior (inside the periphery) of the metal-core PCB. The PCB 400 includes a vertical coil antenna 404 and an MCU 406 that provides wireless functionality and also functions as the controller for the LED driver. In an embodiment the MCU 406 is a Silicon Labs EFR32MG24 2.4 GHz Wireless SOC. In an embodiment the metal core PCB 400 is 40 mm and includes a 3-stage linear LED driver and a low voltage power supply for the MCU, e.g., 1.8-3.8V. In embodiments the wireless MCU supports one or more wireless protocols such as Matter, Open Thread, Zigbee, Bluetooth Low Energy (BLE) to support mesh communication and wireless control. The power consumption is 8-10 W and the embodiment illustrated supports dimming. Of course, other power consumption values, e.g., up to 20 W or even higher are possible depending on the particular lamp implementation.

Figure 5:
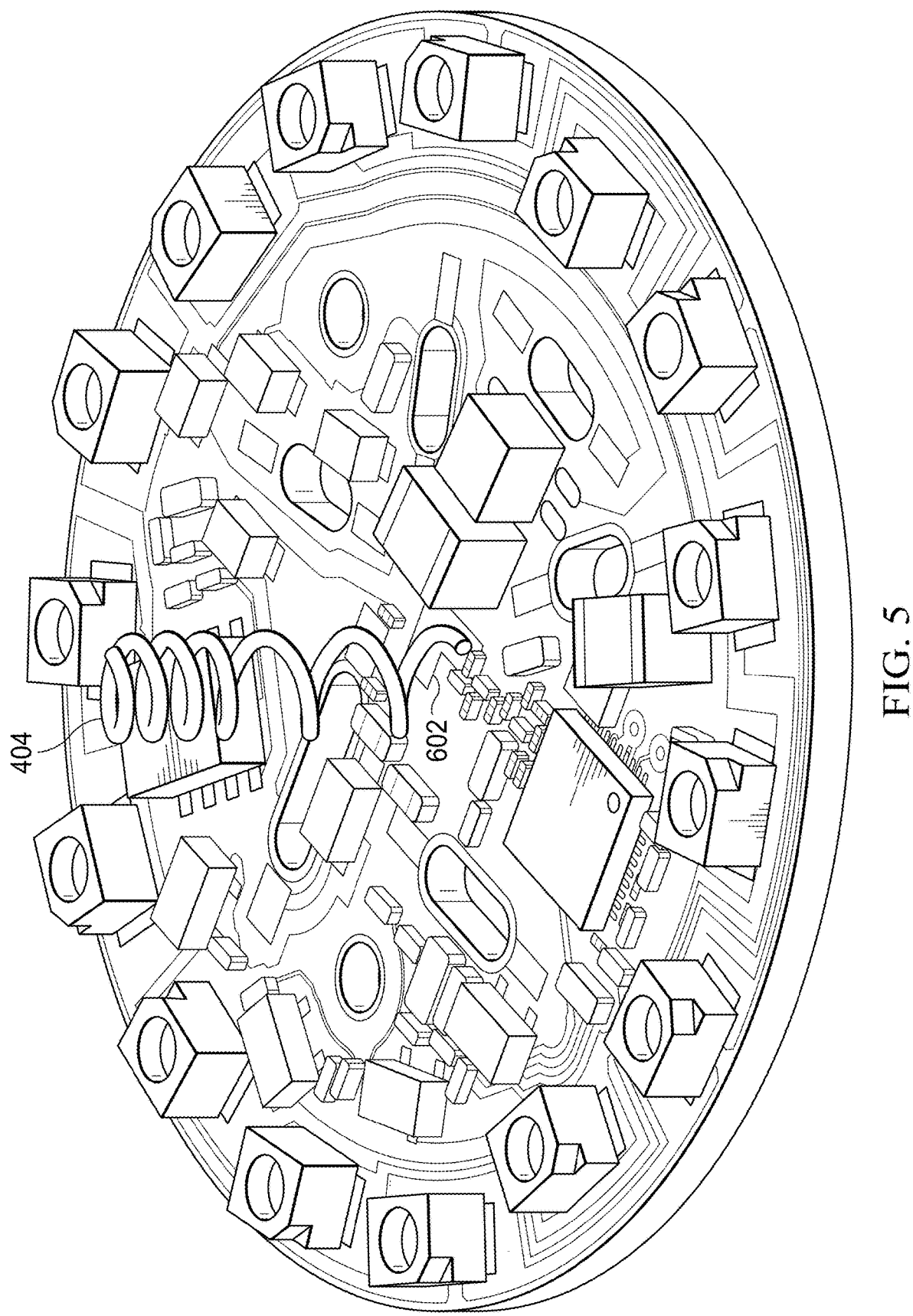
FIG. 5 illustrates a PCB with a vertical coil antenna.
Figure 6A:
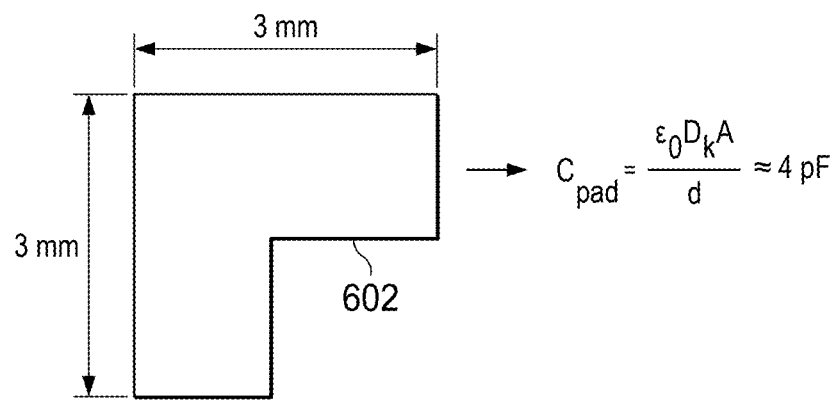
FIG. 6A illustrates an SMD pad used to connect the antenna to the PCB.
Figure 6B:
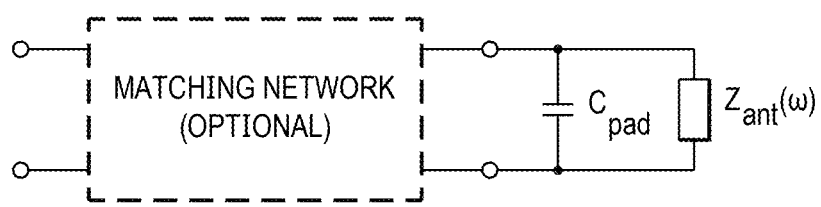
FIG. 6B illustrates the capacitance of the pad and the impedance of the antenna coupled in parallel.

FIG. 5 shows another view of a vertical coil antenna 404. Note that the antenna should be elevated from the PCB plane. Because the metal core is capacitively coupled to the RF ground network, the effective antenna area for the antenna is increased. Antenna solutions include the coil spring/helix antenna shown in FIG. 5, a stamped metal antenna, and a wire antenna in the housing. The SMD antenna pad 602 through which an antenna is electrically connected to the PCB is shown in FIG. 6A. The SMD antenna pad can have high parasitic capacitance. The capacitance of the pad is calculated as $$C_{pad} = \frac{\varepsilon_0 D_k A}{d} \approx 4\text{pF},$$

where $\varepsilon_0$ is the permittivity of free space, $D_k$ is dielectric constant of the dielectric layer, A is area, and d is the distance between the pad and the core. Embodiments resonate the pad capacitance with the antenna as shown in FIG. 6B. The resonant frequency formed by Cpad the Zant should be tuned to the fundamental frequency, i.e., the RF operating frequency of, e.g., 2.4 GHz.

Figure 7:
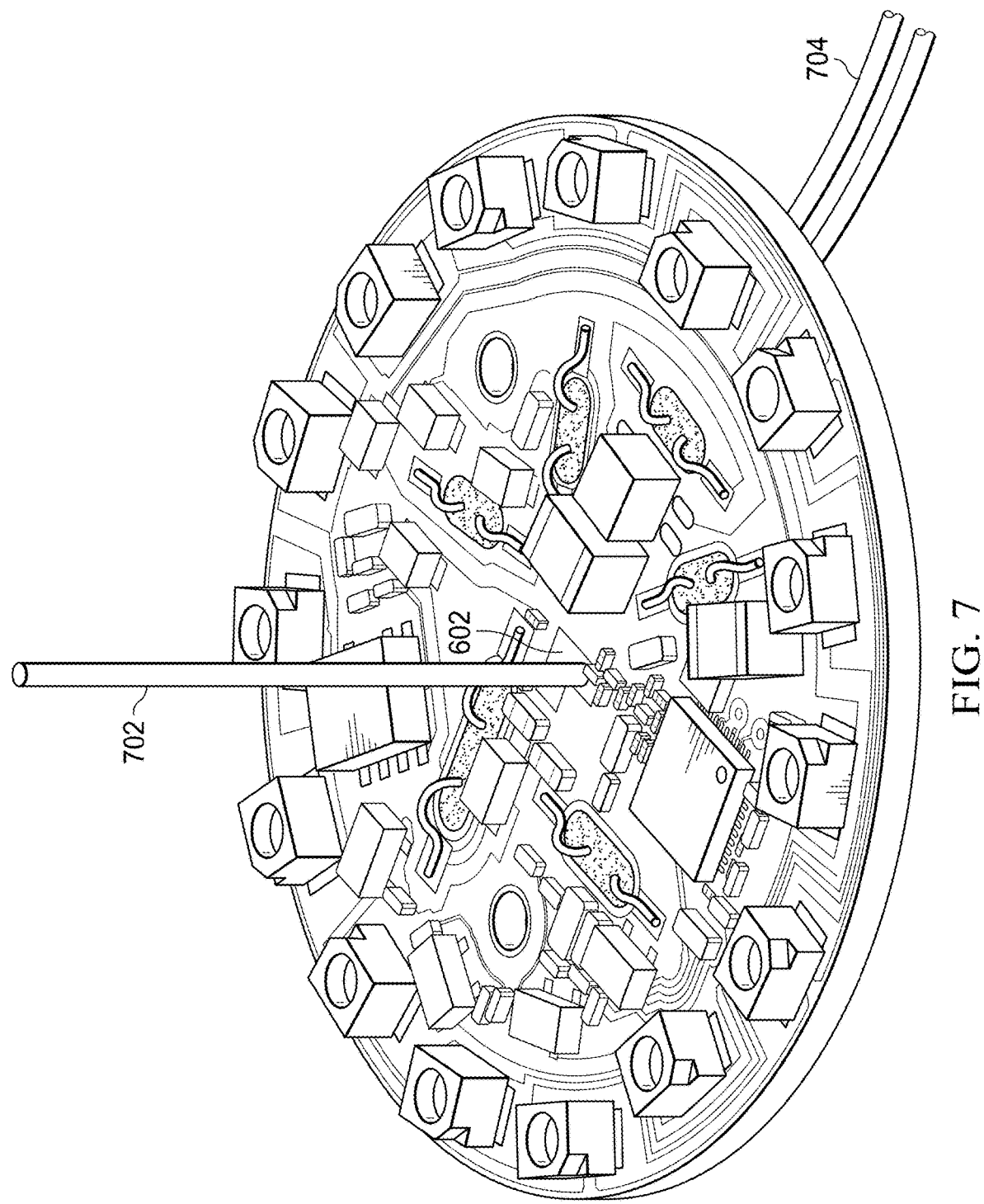
FIG. 7 illustrates a PCB with a straight monopole antenna.

FIG. 7 illustrates an embodiment that uses a monopole antenna 702 rather than the vertical coil antenna. The vertical coil antenna has the advantage of being shorter than the monopole antenna 502, which may be an advantage in certain lamp configurations. FIG. 7 also illustrates that the lamp is line powered through the power lines 704 as opposed to, e.g., being battery powered. Note that the lamp is not isolated from the AC source.

Figure 8:
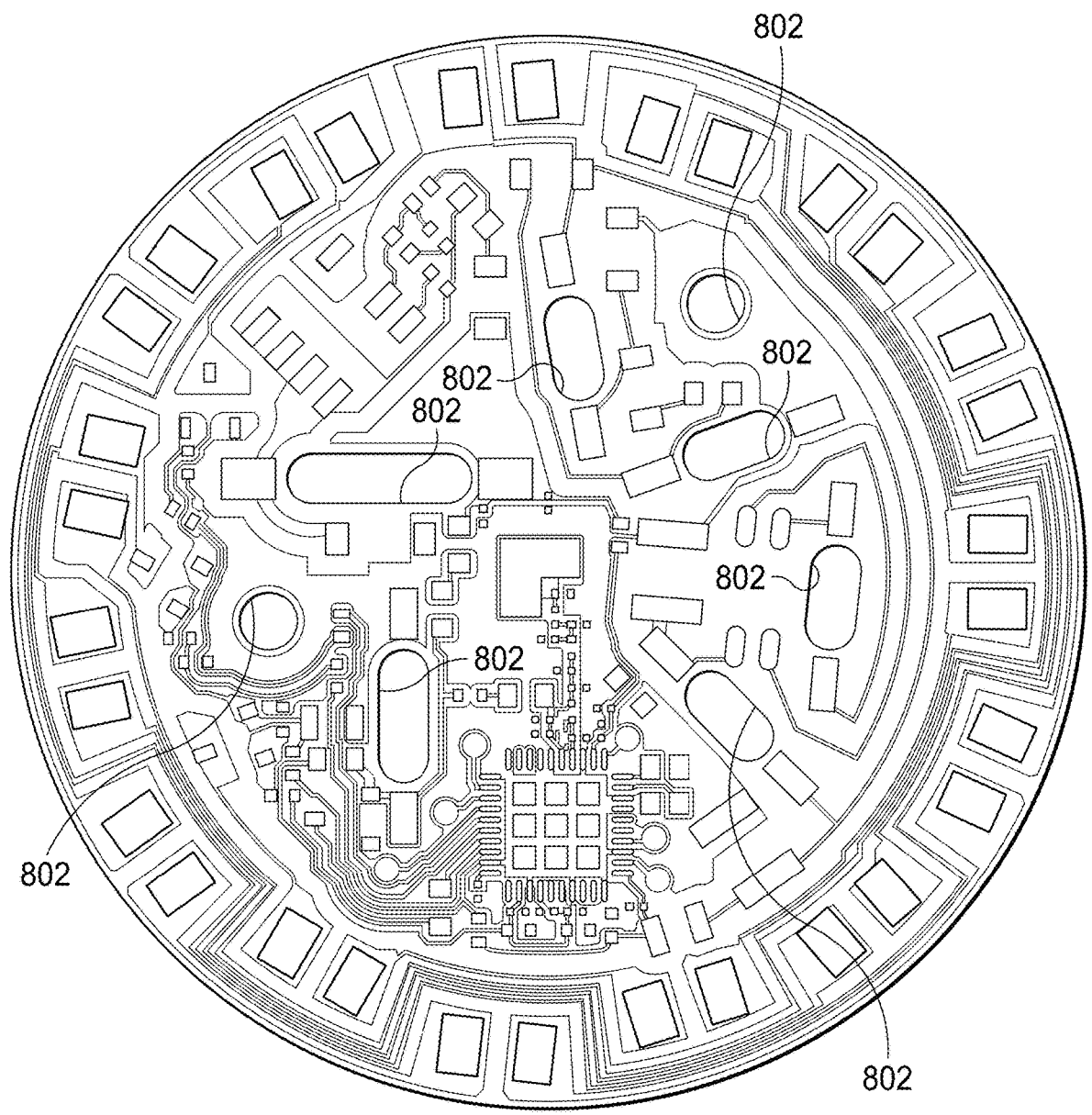
FIG. 8 illustrates use of PCB clearances where there is a high voltage difference between adjacent traces.

FIG. 8 illustrates the PCB clearances where there is a high voltage difference between adjacent traces. Sufficient clearance is the distance kept between any two structures (e.g., traces) on the PCB to prevent high voltage breakdown. FIG. 8 also illustrates slots marked with 802 that are used primarily for mounting through hole components (see FIG. 9) from the bottom side of the PCB. The slots and high voltage clearances can also be seen in FIG. 4 in the same locations. Conformal coating or potting can be used in embodiments to improve high voltage isolation. Note that in one or more embodiments the LED string layout is implemented in such a way that the voltage is gradually decreasing from the periphery to the center of the PCB so the voltage difference between two adjacent traces is minimized.

Figure 9:
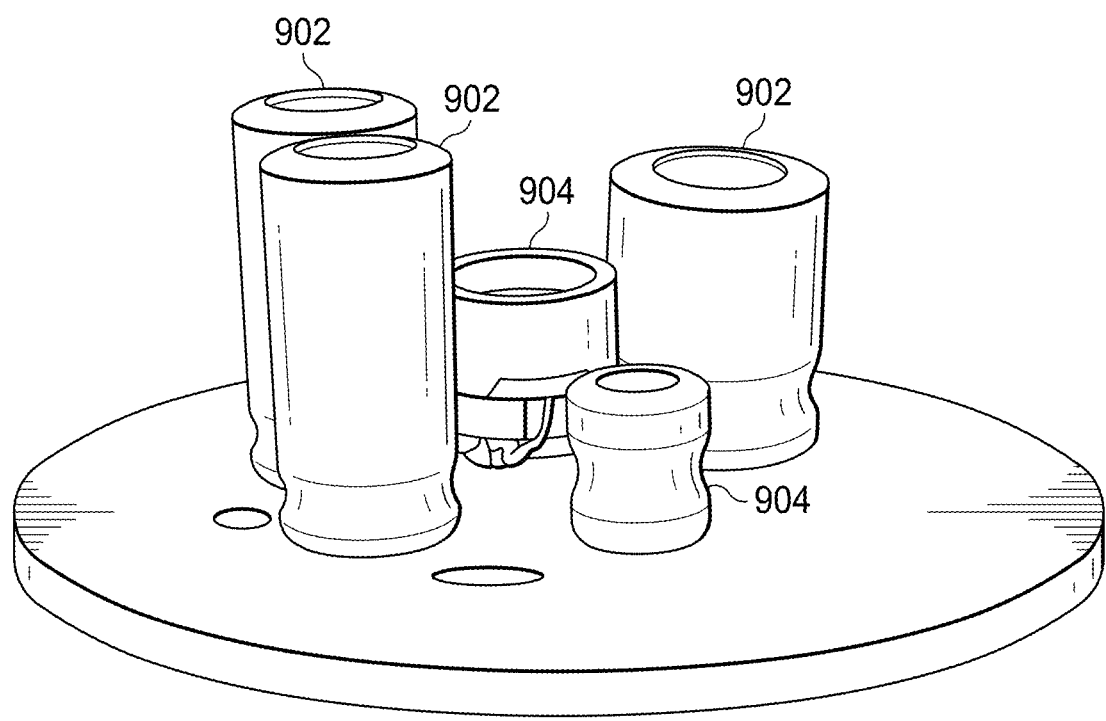
FIG. 9 illustrates inductors and electrolytic capacitors mounted on the bottom side of the metal core PCB.

FIG. 9 illustrates an embodiment in which electrolytic capacitors 902 and power inductors 904 are mounted on the bottom side of the metal core PCB with other electronic components including the LEDs, MCU, etc., (not visible in FIG. 9) being mounted on the top side. Embodiments may require the inductors and capacitors for the power supply and other circuits. The inductors and capacitors are connected to top layer pads through, e.g., the slots 802 shown in FIG. 8 directly or via a through hole to a surface mount technology (SMT) adapter connector. In other embodiments where the PCB has sufficient room, instead of inductors and/or capacitors being mounted on the bottom side of the PCB, surface mount (SMD) capacitors and/or inductors are mounted on the top side of the PCB.

Figure 10:
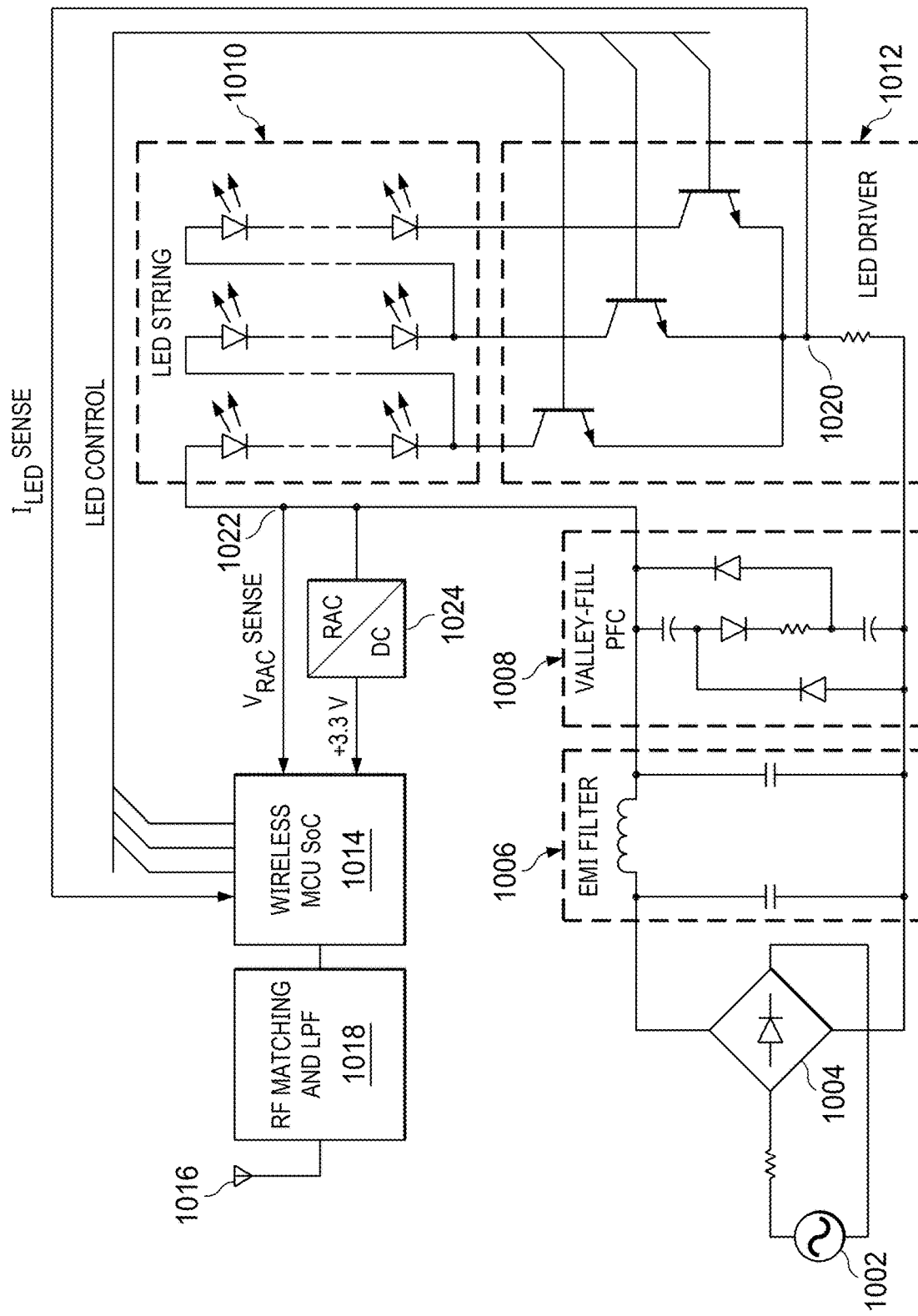
FIG. 10 illustrates a high level system diagram of lamp according to an embodiment.

FIG. 10 illustrates a high-level system diagram of a lamp according to an embodiment. AC power source 1002 supplies a bridge circuit 1004. An optional EMI filter 1006 is coupled to the bridge circuit 1004. A valley-fill power factor correction circuit 1008 is coupled to the EMI Filter 1006 and supplies power to an LED string 1010. The LED string 1010 is controlled by an LED driver circuit 1012. The LED driver 1012 is controlled by the Wireless MCU SoC 1014. The Wireless MCU SoC 1014 (e.g., Silicon Labs EFR32MG24 2.4 GHz Wireless SOC) is coupled to an antenna 1016 through the RF matching network and low pass filter (LPF) 1018. The wireless MCU SoC 1014 provides RF communication and also control for the LED driver and various analog and digital functionality needed for LED control. The MCU SoC senses both LED current at node 1020 and the rectified alternating current (AC) voltage VRAC at node 1022 supplied to the LED string 1010 and uses the sensed current and voltage to control the LED string. A voltage converter 1024 generates a DC voltage for the Wireless MCU SoC from the rectified AC voltage provided by the PFC 1008.

Figure 11:
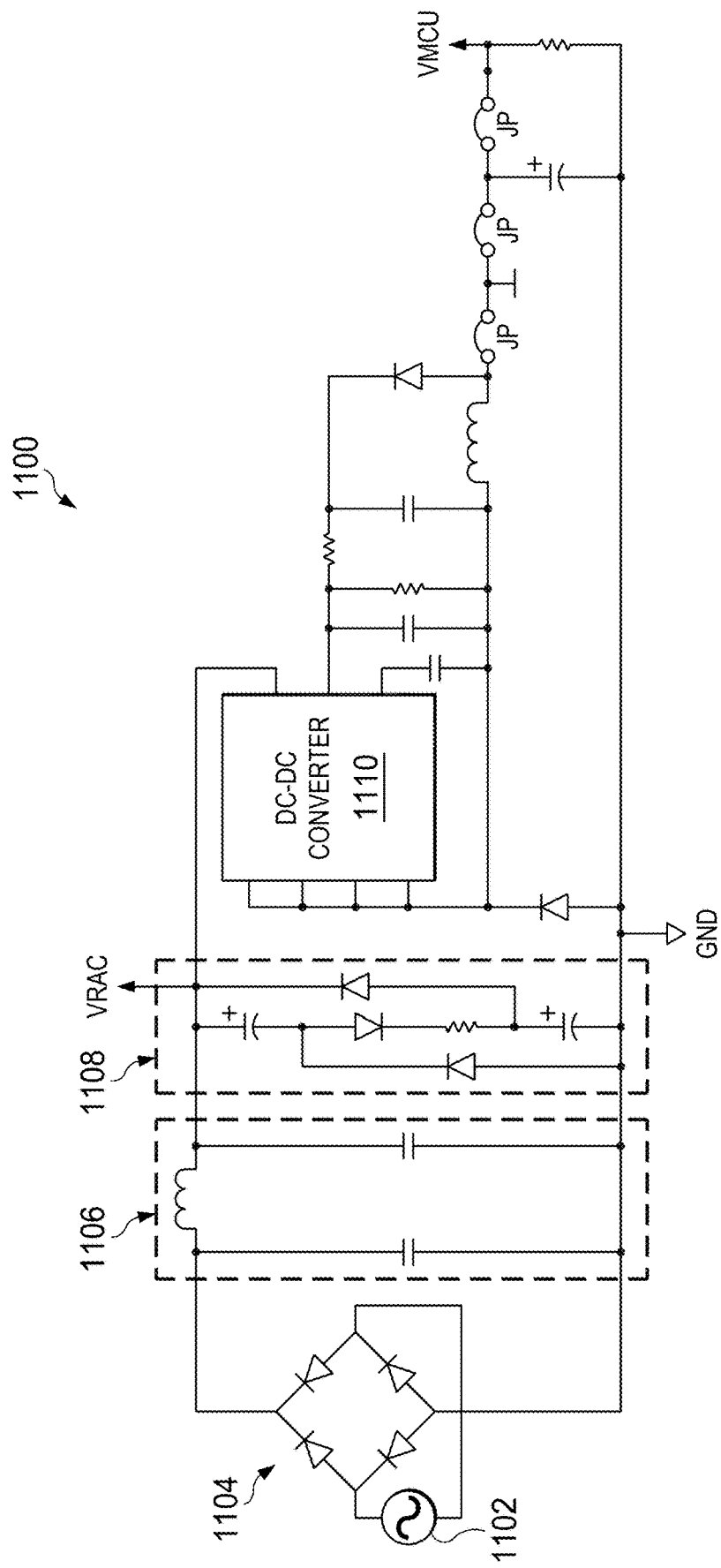
FIG. 11 illustrates an embodiment of a power supply circuit providing power for components in the LED lamp.

FIG. 11 illustrates an embodiment of a power circuit 1100 providing power for components in the LED lamp. The AC supply 1102 is coupled to the bridge rectifier circuit 1104. The power circuit 1100 includes an EMI filter 1106 and a valley fill power factor correction circuit 1108 (described further herein) supplying the rectified AC voltage (VRAC) for the LED string. A DC-DC converter 1110 and associated components (capacitors, inductor, resistors, and diode) generates the DC voltage (VMCU) for the MCU. Some embodiments omit the power factor correction circuit 1108 and/or the EMI filter 1106 and utilize, e.g., a conventional diode bridge circuit with a capacitor to smooth the rectified voltage (or even without the capacitor). Of course, other rectifier topologies can also be used.

Figure 12:
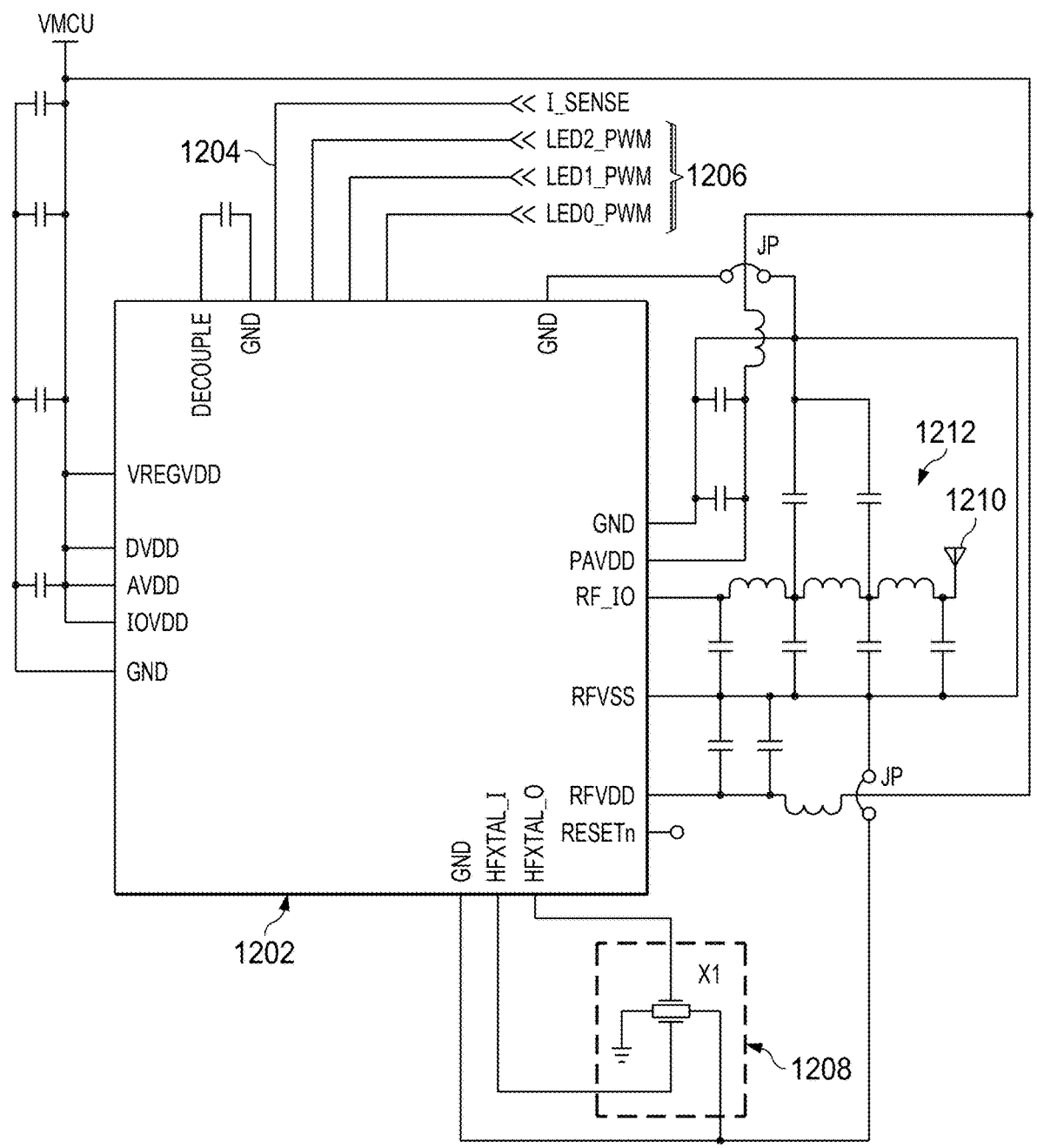
FIG. 12 illustrates an embodiment of connections of the MCU.

FIG. 12 illustrates an embodiment in which the MCU 1202 receives the sense signal 1204 from the LED string, and supplies pulse wave modulated (PWM) signals 1206 (LED0_PWM, LED1_PWM, and LED2_PWM) to control the LEDs. FIG. 12 also shows the crystal oscillator 1208, the antenna 1210, and the passive components 1212 (capacitors and inductors) (corresponding to the matching network and LPF 1018 shown in FIG. 10) used with the antenna 1210. Note that the GND connection can be implemented as shown, e.g., at 1506 in FIG. 15 for unused general purpose I/O (GPIO) pins.

Figure 13:
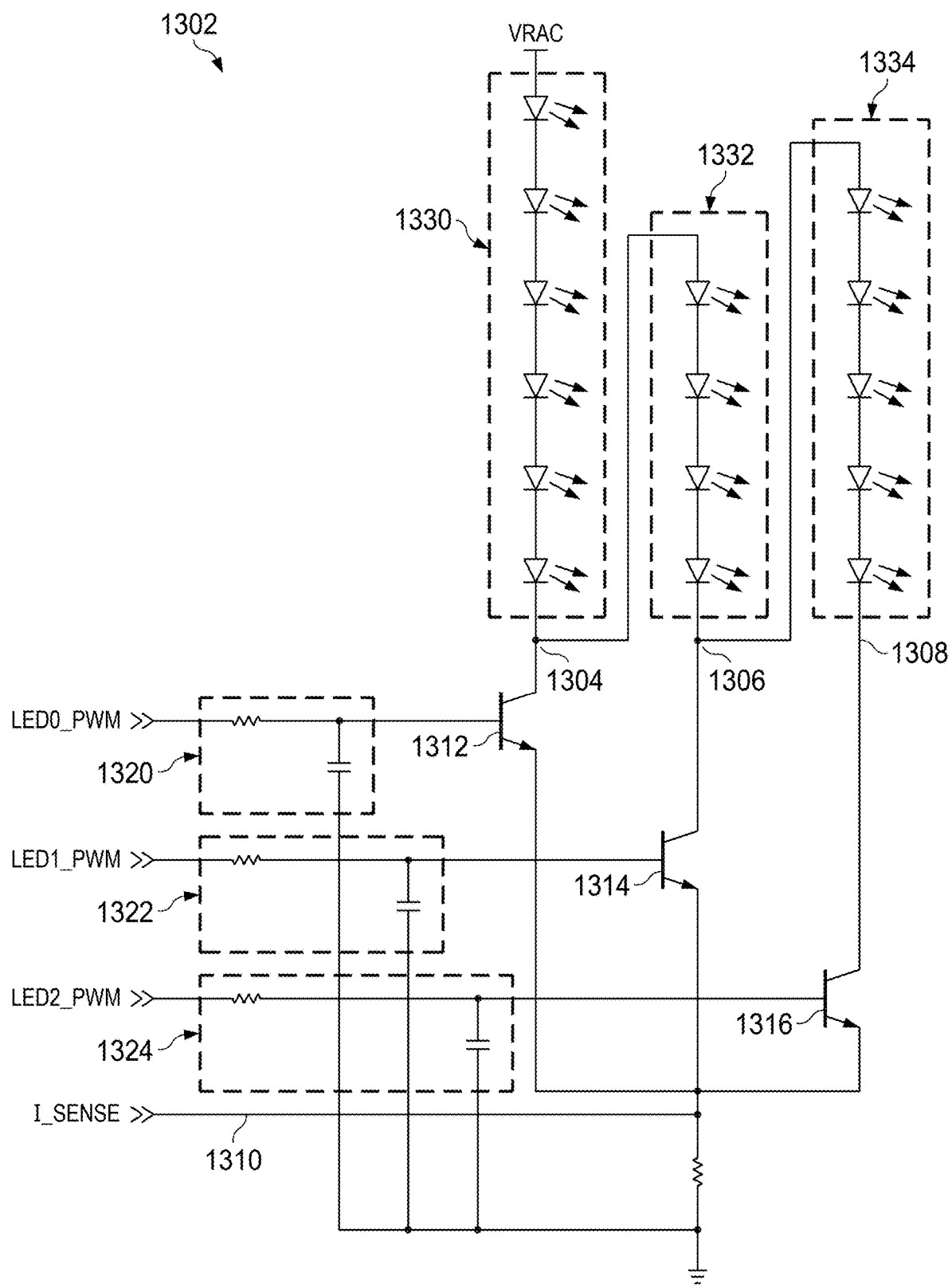
FIG. 13 illustrates the LEDs and an LED drive circuit.

FIG. 13 illustrates the LEDs formed in a string with three tap points and the LED drive circuit. The illustrated embodiment includes the LED segments 1330, 1332, and 1334 with each segment of the string corresponding to one of the tap points at 1304, 1306, and 1308. The sense signal 1310 is supplied to the MCU as shown in FIGS. 10 and 12. The PWM signals (LED0_PWM, LED1_PWM, and LED2_PWM) are control signals supplied to the respective bases of bipolar transistors 1312, 1314, and 1316. The illustrated embodiment also includes RC filters 1320, 1322, and 1324. When transistor 1312 turns on (with transistors 1314 and 1316 off), LED string segment 1330 turns on. When transistor 1314 turns on (and transistors 1312 and 1316 are off) LED string segments 1330 and 1332 are on. When transistor 1316 turns on (and transistors 1312 and 1314 are off) LED string segments 1330, 1332, and 1334 are on. Rather than providing PWM signals, in embodiments, the MCU uses its digital to analog converter (DAC) to convert a digital control signal generated by the MCU and drives transistors with analog signals.

Figure 14:
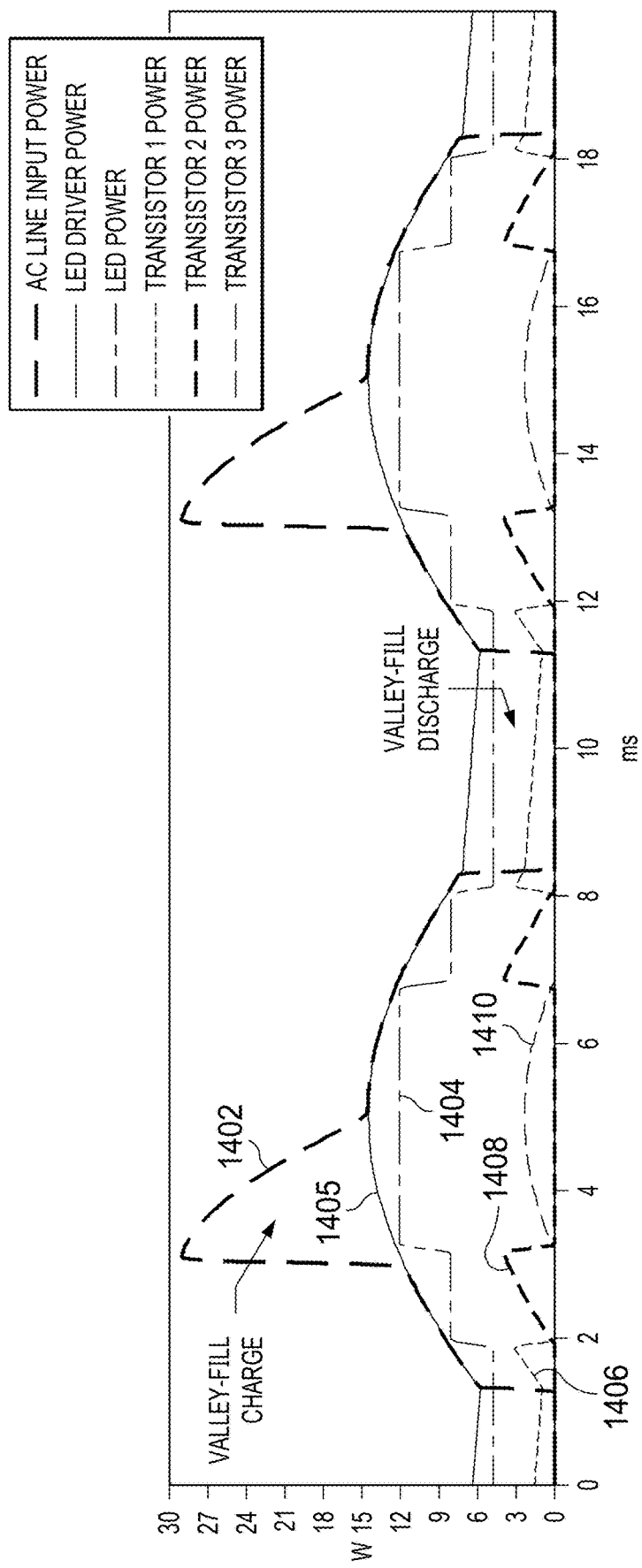
FIG. 14 is a timing diagram associated with the embodiments utilizing a valley fill power factor correction (PFC) circuit.

FIG. 14 is a timing diagram associated with the embodiments shown in FIGS. 10-13 utilizing the valley fill power factor correction (PFC) circuit. Note that the valley fill PFC circuit 1108 shown in FIG. 11 differs from the basic diode bridge and single capacitor rectifier. Due to the way the capacitors and diodes are connected in the valley fill circuit, the capacitors are effectively connected in series when they are charging and in parallel when discharging. Use of the valley fill PFC circuit 1108 reduces the voltage rating needed for the capacitors by half, doubles the maximum discharge current, and provides a better power factor compared to the conventional rectifier circuit that uses a single capacitor to smooth the rectified voltage of the diode bridge.

FIG. 14 illustrates the AC Line Input Power 1402 drawn from the AC supply (1102 in FIGS. 11 and 1002 in FIG. 10). Each cycle, the lamp starts with just string 1330 on with the transistor 1312 turned on (see FIG. 13). The LED power 1404 increases as the rectified AC line input voltage (VRAC) increases. The LED driver power 1405 corresponds to the total power drawn by the LEDs and the LED driver transistors. The transistor power 1406 is associated with Transistor 1. The transistor power 1408 is associated with Transistor 2. The transistor power 1410 is associated with Transistor 3. Transistors 1, 2, and 3 correspond respectively to transistors 1312, 1314, and 1316 shown in FIG. 13. The "transistor power" is the power dissipated by that specific transistor that is basically loss. Transistor power is the product of the transistor current (that is identical to the LED current when the transistor is conducting and constant in this case but could have other waveforms as well, depending on the control signals) and VRAC-VLED (where VLED is the voltage drop on all the active LEDs). Note that Transistor 1 power goes to 0 as Transistor 2 power increases, and Transistor 2 power goes to 0 as Transistor 3 power increases. The LED driver power is highest with Transistor 3 on. As the LED Driver power decreases Transistor 3 power goes to zero and Transistor 2 power increases again. As the LED Driver power continues to decrease with the decrease in AC line input voltage and power, Transistor 2 power goes to 0 and Transistor 1 power goes back up and a new cycle begins. The transistor power for the three transistors going up and down corresponds to the transistors 1312, 1314, and 1316 being turned on and off. The LED power peaks between ~3 ms and ~7 ms with Transistor 3 on. FIG. 14 shows that when Transistor 2 turns on at approximately 2 ms, VRAC≈VLED and thus transistor power for Transistor 2 is close to 0 (and Transistor 1 transistor power is 0 since it is off) but then VRAC increases while VLED remains the same so the dissipated power of transistor 2 increases until Transistor 3 turns on at approximately 3.3 ms and Transistor 2 turns off. At that point, VRAC≈VLED again so Transistors 3 power starts close to 0 and ramps up as the LED Driver Power increases and then ramps down after the LED Driver Power peaks and then decreases until Transistor 2 again turns on. As LED Driver Power continues to ramp down Transistor 2 power ramps down until Transistor 1 again turns on at approximately 8 ms and is powered between ~8.5 ms and ~11.5 ms by the Valley-Fill discharge.

Valley-Fill Charge shown in FIG. 14 is the period (between ~3 ms and ~5 ms) when the capacitors in the valley fill circuit are charged. The Valley-Fill Discharge (between ~8.5 ms and ~11.5 ms) is the period when the valley fill circuitry is supplying the LED driver. If one calculates the Valley-Fill Charge and Discharge energies by integrating the AC Line Input Power above the LED Driver Power in the shark fin shape and the LED Driver Power in the Valley-Fill Discharge period, one gets the same energy (neglecting the losses). The AC line input power drops to 0 W between ~8.5 ms and ~11.5 ms because the AC line voltage drops below AC peak voltage/2 in that period and the valley-fill circuitry takes over, which is the valley-fill discharge phase.

The valley fill charge power is shark fin shaped because the charging current is proportional to the to the change in the sinusoidal rectified AC voltage (so it decreases as the AC voltage approaches its peak and is 0 at the AC voltage peak) and because the diodes "block" the charging until the ac voltage reaches the voltage on the two capacitors in series. The MCU 1202 (see FIG. 12) senses VRAC to determine when to turn on and off the three transistors. Other embodiments sense the non-rectified AC line voltage, but sensing VRAC is more accurate since that is the actual voltage that drives the LEDs. Of course, if there are more tap points to improve efficiency, additional transistors are controlled. Other control information, e.g., dimming, can be provided from the wireless interface.

Figure 15:
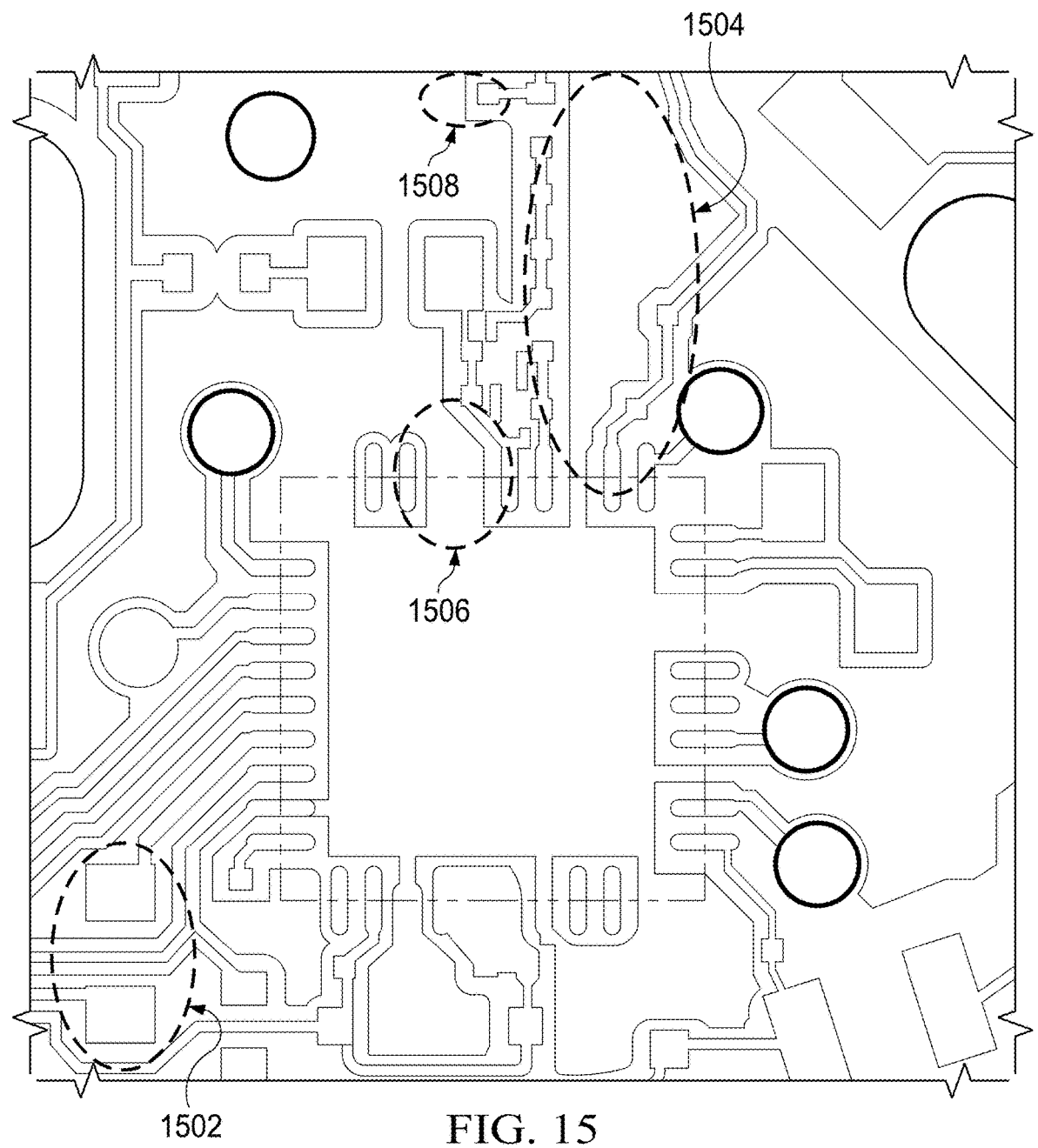
FIG. 15 illustrates some single-layer RF design best practices.
Figure 16:
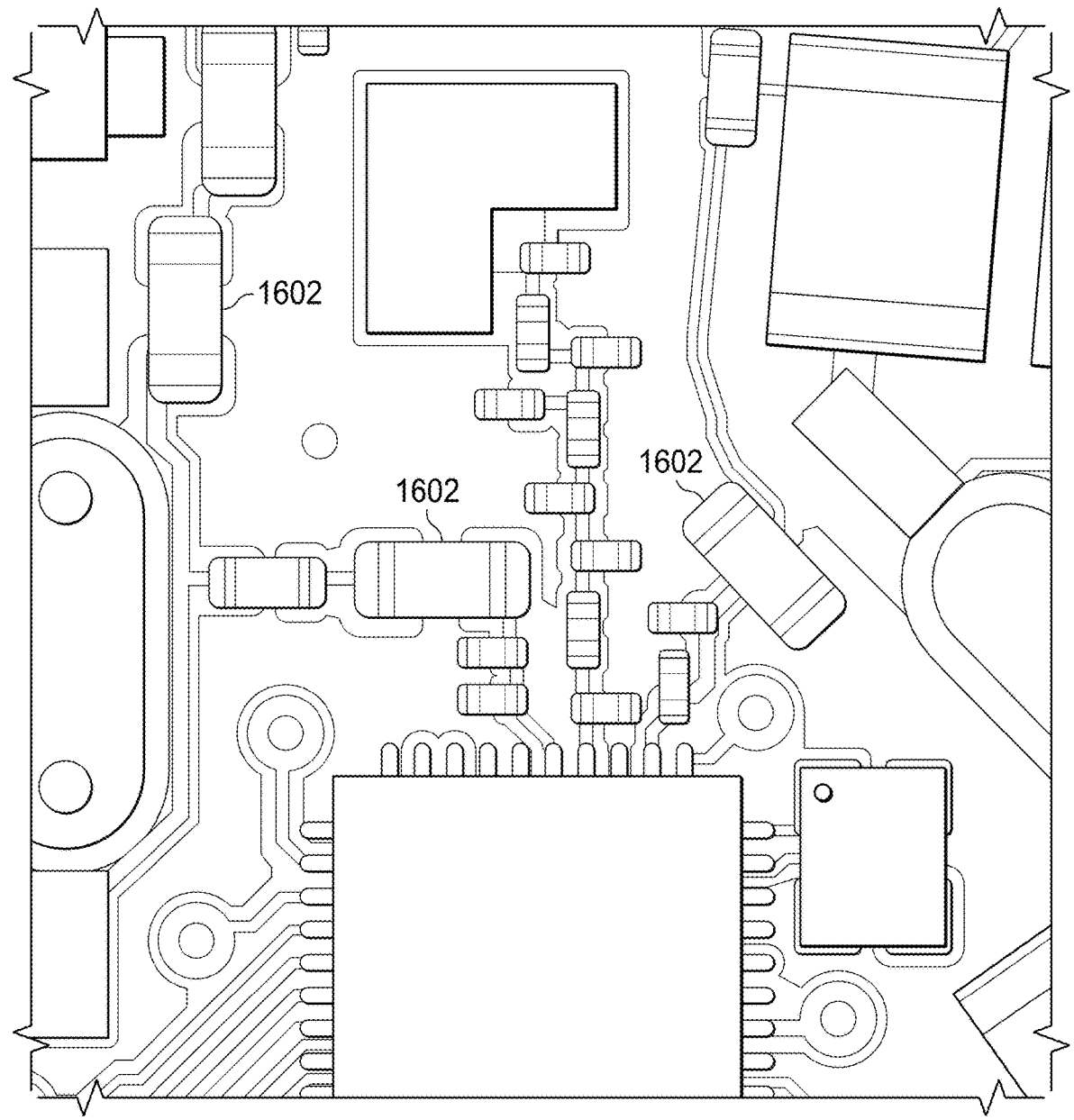
FIG. 16 illustrates some single-layer RF design best practices.

FIG. 15 illustrates some single-layer RF design best practices incorporated in embodiments described herein. Note that some of the design practices may be omitted depending on the particular design. Embodiments use 0 ohm SMD chip resistors as jumpers as shown at 1502. Embodiments ensure low impedance paths for high frequency ground currents. Embodiments use GND pour and wide GND traces shown at 1504. Unused GPIO pins are shorted to ground as shown at 1506. Embodiments use an exposed GND pad as a center of star routing. Embodiment use bypass capacitors to short different nets at RF to increase the effective ground area and to shunt spurious currents at critical points shown at 1508. FIG. 16 illustrates some additional best practices including the use of 0 ohm SMD chip resistors as jumpers 1602 (shown as jumpers JP in FIGS. 11 and 12). Some embodiments utilize capacitive coupling to the metal core.

Figure 17:
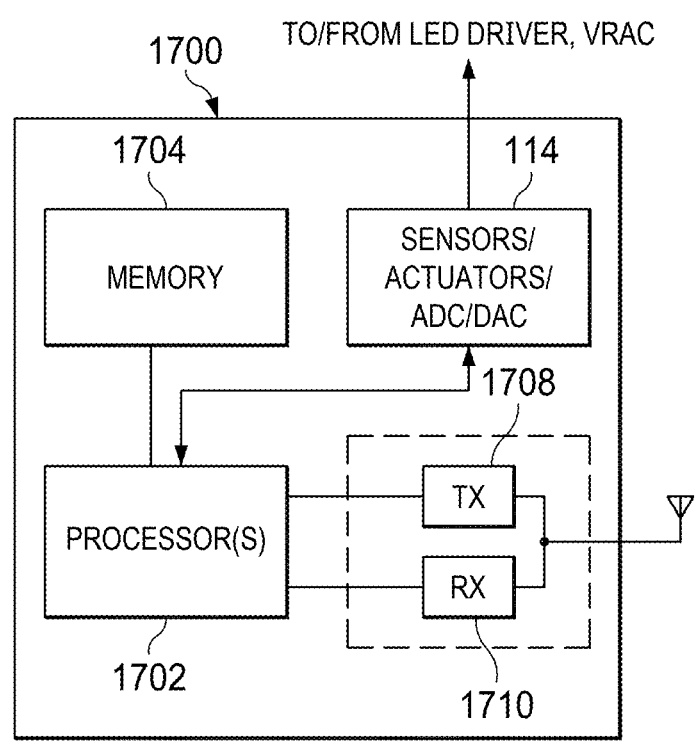
FIG. 17 illustrates a high-level block diagram of an MCU according to an embodiment.

FIG. 17 illustrates a high level block diagram of an MCU 1700 that includes one or more processors 1702 and memory 1704. The memory 1704 may include static RAM access memory (SRAM), dynamic random access memory (DRAM), non-volatile memory such as flash memory. The memory 1704 stores instructions and data used by the processor(s) 1702. The MCU 1700 provides wireless communication capability using the communication circuits 1706 that includes the transmitter 1708 and the receiver 1710, which are compliant with one or wireless communication protocols. The transmitter includes appropriate filters, modulator, local oscillator, and other functionality in the transmit chain well known in the art. Similarly, the receiver includes a demodulator, filters, local oscillator (which may be shared with the transmitter), and other functionality in the receive chain that is well known in the art. Some of the functionality required by the transmit and receive chain may be performed in the processor(s) 1702. The RF communication capability allows remote control of the LED lamp to turn the lamp on, off, dim, brighten, adjust color, or otherwise control lamp characteristics and receive lamp status.

The processor(s) 1702 are in communication with the sensors actuators 114, that supply control signals to the LED driver and receive data such as a current sense signal from the LED driver circuit and VRAC as part of controlling the LEDs. The analog to digital converters (ADCs) and digital to analog converters (DACs) may be used, e.g., to convert the current sense signal or VRAC to digital values for use by the processor. The processor(s) 1702 are programmed, e.g., to control the LEDs according to control information received from the receiver 1710 and provide status of the LEDs over transmitter 1708.

It is noted that the functional blocks, devices, and/or circuitry described herein can be implemented using various combinations of analog circuits, digital circuits, and programmable circuits such as software programmed on microcontroller unit (MCU) or other processor to provide the functionality described herein. It is further noted that the software or other programming instructions can be stored in one or more non-transitory computer-readable mediums (e.g., SRAM, DRAM, non-volatile memory, etc.), and the software or other programming instructions when executed by the programmable integrated circuits cause the programmable integrated circuits to perform at least some of the processes, functions, and/or capabilities described herein.

Thus, a connected LED lamp implemented on a single 1-layer metal core PCB has been described. The description of the invention set forth herein is illustrative and is not intended to limit the scope of the invention as set forth in the following claims. For example, equivalent elements may be substituted for those illustrated and described herein, and certain features may be utilized independently of the use of other features, all as would be apparent to one skilled in the art after having the benefit of this description. Note that the terms "first," "second," "third," and so forth, as used in the claims, unless otherwise clear by context, is to distinguish between different items in the claims and do not otherwise indicate or imply any order in time, location, or quality. Variations and modifications of the embodiments disclosed herein may be made based on the description set forth herein, without departing from the scope of the invention as set forth in the following claims.

What is claimed is:

1. A lamp comprising:
    a printed circuit board (PCB);
    wherein the PCB includes,
        a plurality of light emitting diodes (LEDs) disposed on a periphery of the PCB;
        an LED driver circuit;
        a microcontroller unit (MCU) with wireless capability to provide wireless connectivity and control for the LED driver circuit;
        a power supply circuit coupled to receive AC power and supply power for the LEDs, the LED driver circuit, and the MCU;
        an antenna coupled to the MCU;
        a pad through which the antenna is coupled to the PCB; and
        wherein the antenna is resonated with a capacitance of the pad and a resonant frequency generated using the capacitance of the pad and an impedance of the antenna is tuned to an RF operating frequency.

2. The lamp as recited in claim 1 wherein the PCB is a 1-layer metal core PCB.

3. The lamp as recited in claim 2 wherein the antenna is a helical antenna mounted on the 1-layer metal core PCB.

4. The lamp as recited in claim 2 wherein the antenna is a monopole antenna mounted on the 1-layer metal core PCB.

5. The lamp as recited in claim 2 further comprising at least one capacitor mounted on a bottom side of the 1-layer metal core PCB opposite a top side on which the LEDs are disposed and coupled to the top side through slots in the PCB.

6. The lamp as recited in claim 2 further comprising at least one inductor mounted on a bottom side of the 1-layer metal core PCB opposite a top side on which the LEDs are disposed and coupled to the top side through slots in the PCB.

7. The lamp as recited in claim 1 wherein the antenna is coupled to the MCU through a matching network.

8. The lamp as recited in claim 1 wherein the LED driver circuit comprises:
   a first transistor configured to turn on a first segment the plurality of LEDs responsive to assertion of a first transistor control signal controlled by the MCU; and
   a second transistor configured to turn on the first segment and a second segment of the plurality of LEDs, responsive to assertion of a second transistor control signal controlled by the MCU.

9. The lamp as recited in claim 1 wherein the LED driver circuit is disposed inside the periphery.

10. A lamp comprising:
    a 1-layer metal core printed circuit board (PCB);
    wherein the 1-layer metal core PCB includes,
       a plurality of light emitting diodes (LEDs);
       an LED driver circuit to drive the LEDs;
       a microcontroller unit (MCU) providing wireless connectivity and control for the LED driver circuit;
       a power supply circuit coupled to an AC source and providing power for the LEDs, the LED driver circuit, and the MCU;
       a pad through an antenna is coupled to the 1-layer metal core PCB; and
       wherein the antenna is resonated with a capacitance of the pad and a resonant frequency generated using the pad and an impedance of the antenna is tuned to a radio frequency (RF) operating frequency.

11. The lamp as recited in claim 10 wherein the antenna is a helical antenna.

12. The lamp as recited in claim 10 wherein the antenna is a monopole antenna.

13. The lamp as recited in claim 10 further comprising at least one capacitor mounted on a bottom side of the 1-layer metal core PCB opposite a top side of the 1-layer metal core PCB on which the LEDs are mounted and coupled to the top side through slots in the PCB.

14. The lamp as recited in claim 10 further comprising at least one inductor mounted on a bottom side of the 1-layer metal core PCB opposite a top side of the 1-layer metal core PCB on which the LEDs are mounted and coupled to the top side through slots in the PCB.

15. The lamp as recited in claim 10 wherein the LEDs are disposed on a periphery of a top side of the 1-layer metal core PCB and the MCU is disposed on the top side of the 1-layer metal core PCB inside of the periphery.

16. A lamp comprising:
    a single 1-layer metal core printed circuit board (PCB);
    wherein the 1-layer metal core PCB includes,
       a plurality of light emitting diodes (LEDs) arranged on a periphery of the 1-layer metal core PCB;
       an LED driver circuit;
       a microcontroller unit (MCU) providing wireless connectivity and control for the LED driver circuit;
       a power supply circuit coupled to an AC source and providing power for the LEDs, the LED driver circuit, and the MCU; and
       wherein voltage gradually decreases from the periphery to a center of the single 1-layer metal core PCB.

17. The lamp as recited in claim 16 wherein the single 1-layer metal core PCB further comprises:
    a pad through which an antenna is coupled to the single 1-layer metal core PCB; and
    wherein the antenna is resonated with a capacitance of the pad and a resonant frequency generated using the capacitance of the pad and an impedance of the antenna is tuned to a radio frequency (RF) operating frequency.

* * * * *